US007825502B2

(12) United States Patent
Irving et al.

(10) Patent No.: US 7,825,502 B2
(45) Date of Patent: Nov. 2, 2010

(54) SEMICONDUCTOR DIE PACKAGES HAVING OVERLAPPING DICE, SYSTEM USING THE SAME, AND METHODS OF MAKING THE SAME

(75) Inventors: Scott Irving, Cape Elizabeth, ME (US); Yong Liu, Scarborough, ME (US); Qiuxiao Qian, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 178 days.

(21) Appl. No.: 11/971,524

(22) Filed: Jan. 9, 2008

(65) Prior Publication Data

US 2009/0174047 A1 Jul. 9, 2009

(51) Int. Cl.
*H01L 23/495* (2006.01)
*H01L 23/02* (2006.01)
*H01L 23/48* (2006.01)
*H01L 23/52* (2006.01)
*H01L 29/40* (2006.01)

(52) U.S. Cl. ................ 257/676; 257/686; 257/772; 257/777; 257/779

(58) Field of Classification Search ................ 257/686, 257/772, 777, 779
See application file for complete search history.

(56) References Cited

U.S. PATENT DOCUMENTS

| 5,283,717 | A * | 2/1994 | Hundt ...................... 361/813 |
| 6,118,176 | A * | 9/2000 | Tao et al. .................. 257/676 |
| 6,291,881 | B1 * | 9/2001 | Yang ....................... 257/723 |
| 6,307,257 | B1 * | 10/2001 | Huang et al. ............ 257/676 |
| 6,462,422 | B2 * | 10/2002 | Huang ...................... 257/777 |
| 6,747,361 | B2 * | 6/2004 | Ichinose .................. 257/784 |
| 6,885,092 | B1 * | 4/2005 | Sakuma et al. ........... 257/686 |
| 7,002,251 | B2 * | 2/2006 | Egawa ..................... 257/734 |
| 7,132,747 | B2 * | 11/2006 | Kwon et al. .............. 257/724 |
| 7,227,251 | B2 * | 6/2007 | Sakuma et al. ........... 257/686 |
| 7,282,390 | B2 * | 10/2007 | Tan et al. ................. 438/109 |
| 2002/0155642 | A1 | 10/2002 | Noquil et al. |
| 2002/0167075 | A1 | 11/2002 | Madrid |
| 2003/0085456 | A1 | 5/2003 | Lee et al. |
| 2003/0107126 | A1 | 6/2003 | Joshi |
| 2003/0122247 | A1 | 7/2003 | Joshi |
| 2003/0205798 | A1 | 11/2003 | Noquil et al. |

(Continued)

OTHER PUBLICATIONS

U.S. Appl. No. 11/857,199, Liu et al.

*Primary Examiner*—Leonardo Andújar
*Assistant Examiner*—Teresa M Arroyo
(74) *Attorney, Agent, or Firm*—Townsend and Townsend and Crew LLP

(57) ABSTRACT

Disclosed are semiconductor die packages having overlapping dice, systems that use such packages, and methods of making such packages. An exemplary die package comprises a leadframe, a first semiconductor die, and a second semiconductor die that has a recessed portion in one of its surfaces. The first die is disposed over a first portion of the leadframe, and the second die is disposed over a second portion of the leadframe with its recess portion overlying at least a portion of the first die. Another exemplary die package comprises a leadframe with a recessed area, a first semiconductor die disposed in the recessed area, and a second semiconductor die overlying at least a portion of the first die. Preferably, electrically conductive regions of both dice are electrically coupled to a conductive region of the leadframe to provide an interconnection between dice that has very low parasitic capacitance and inductance.

30 Claims, 7 Drawing Sheets

U.S. PATENT DOCUMENTS

| | | |
|---|---|---|
| 2004/0125573 A1 | 7/2004 | Joshi et al. |
| 2004/0159939 A1 | 8/2004 | Joshi |
| 2005/0285238 A1 | 12/2005 | Joshi et al. |
| 2007/0164428 A1 | 7/2007 | Elbanhawy et al. |
| 2007/0249092 A1 | 10/2007 | Joshi et al. |
| 2007/0262346 A1* | 11/2007 | Otremba et al. ............ 257/177 |
| 2008/0054417 A1 | 3/2008 | Lee et al. |
| 2008/0224285 A1 | 9/2008 | Lim et al. |
| 2009/0079092 A1 | 3/2009 | Liu et al. |
| 2009/0127685 A1 | 5/2009 | Jong et al. |
| 2009/0140369 A1 | 6/2009 | Lee |
| 2009/0146284 A1 | 6/2009 | Kim et al. |

* cited by examiner

SEMICONDUCTOR DIE PACKAGES HAVING OVERLAPPING DICE, SYSTEM USING THE SAME, AND METHODS OF MAKING THE SAME

CROSS-REFERENCES TO RELATED APPLICATIONS

NOT APPLICABLE

BACKGROUND OF THE INVENTION

Semiconductor die packages are currently used in power supplies for computers. Because these die packages dissipate large amounts of heat for these applications, one semiconductor device is generally provided in each package so as to allow for a dedicated heat sink for each device. A recent trend in the industry has been to use a system of distributed power supplies in computers, server systems, and other electronic devices and the like, where several smaller buck converters supply individual components instead of a single power converter, such as a forward converter. In the distributed buck-converter configuration, the input AC power can be converted by an AC-to-DC converter to an intermediate DC voltage that is unregulated, or lightly-regulated, typically in the range of 5 to 50 volts, and a plurality of distributed DC-to-DC buck converters convert the intermediate DC voltage to regulated levels in the range of ±2 volts to ±12 volts for specific components of the system. This configuration enables the control feedback control loop of the AC-to-DC converter to be optimized for good power-factor-correction (PFC) performance since it does not have to precisely control the final output voltages to the components. The configuration also enables the buck converters to better isolate the current demands of the system's components from one another. While this configuration has many advantages, it has a disadvantage of requiring additional components and additional board space.

BRIEF SUMMARY OF THE INVENTION

As part of making their invention, the inventors have recognized that the above-distributed two-stage power-conversion topology suffers from a lower overall power-conversion efficiency due, in part, to parasitic capacitances and inductances in the interconnect wires that electrically interconnect the converter's switching transistors. The inventors have further recognized that the buck converters used in the above-described configuration typically have duty-cycles substantially less than 50%, and therefore the size of the high-side power device (i.e., the device that charges the buck inductor from the intermediate DC voltage) may be significantly smaller than the low-side power device (i.e., the device that provides the synchronous free-wheeling rectifier). Because of the size difference and low duty cycle, the dice for the high-side and low-side devices may be incorporated into a single semiconductor die package. In addition, the inventors have further discovered that the parasitic capacitances and inductances associated with the power transistors can be substantially reduced by disposing the dice of the devices in an overlapping relationship in the package, and by using a lead frame to interconnect the dice. The reduction of the parasitic capacitances and inductances reduces the switching losses of the buck converter, and enables the use of higher switching frequencies, which further reduces losses and improves power-conversion efficiency. Moreover, the inventors have further discovered that power-dissipation of the high-side device does not pose a significant additional burden on the heat sink for the package because of the low duty cycle, and because of the reduction in switching losses provided by reduction of parasitic capacitances and inductances.

Accordingly, a first general embodiment of the invention is directed to a semiconductor die package comprising a leadframe having at least one electrically conductive region, a first semiconductor die having a first surface, a second surface, and at least one electrically conductive region disposed at one of its surfaces, and a second semiconductor die having a first surface, a second surface, a recessed portion disposed at its second surface, and at least one electrically conductive region disposed at one of its surfaces. At least a portion of the second surface of the first semiconductor die and at least a portion of the recessed portion of the second semiconductor die face each other. Also, at least one electrically conductive region of one of the semiconductor dice is electrically coupled to the at least one electrically conductive region of the leadframe. In preferred embodiments, electrically conductive regions of both semiconductor dice are electrically coupled to the at least one electrically conductive region of the leadframe to provide an interconnection between dice that has very low parasitic capacitance and parasitic inductance.

A second general embodiment of the invention is directed to a semiconductor die package comprising a leadframe, a first semiconductor die, and a second semiconductor die. The leadframe has a first surface, a second surface, a recessed area disposed at the first surface, and at least one electrically conductive region disposed at the first surface. The first semiconductor die has a first surface, a second surface, and at least one electrically conductive region disposed at one of its surfaces, with the first semiconductor die being disposed in the recessed area of the leadframe. The second semiconductor die has a first surface, a second surface, and at least one electrically conductive region disposed at one of its surfaces, with the second semiconductor die being disposed over at least a portion of the recessed area of the leadframe, and over at least a portion of the first semiconductor die. Also, at least one electrically conductive region of one of the semiconductor dice is electrically coupled to the at least one electrically conductive region of the leadframe. In preferred embodiments, electrically conductive regions of both semiconductor dice are electrically coupled to the at least one electrically conductive region of the leadframe to provide an interconnection between dice that has very low parasitic capacitance and parasitic inductance.

Another general embodiment of the invention is directed to a method for forming a semiconductor die package representative of the above-described first general embodiment. The general embodiment comprises assembling the leadframe, the first semiconductor die, and the second semiconductor die together with at least a portion of the second surface of the first semiconductor die and at least a portion of the recessed portion of the second semiconductor die facing one another, and with at least one electrically conductive region of one of the semiconductor dice electrically coupled to the at least one electrically conductive region of the leadframe.

Another general embodiment of the invention is directed to a method for forming a semiconductor die package representative of the above-described second general embodiment. The general embodiment comprises assembling the leadframe, the first semiconductor die, and the second semiconductor die together with the first semiconductor die disposed within the recessed area of the leadframe, with at least a portion of the second surface of the first semiconductor die and at least a portion of the second surface of the second semiconductor die facing one another, and with at least one electrically conductive region of one of the semiconductor dice electrically coupled to the at least one electrically conductive region of the leadframe.

The present invention also encompasses systems that include packages according to the present invention, each such system having an interconnect substrate and a semiconductor die package according to the present invention attached to the interconnect substrate, with electrical connections made therewith.

Accordingly, it is an objective of the present invention to provide inexpensive semiconductor die packages for buck power converters, other power converters, and other electronic circuits.

Accordingly, it is another objective of the present invention to provide compact semiconductor die packages for buck power converters, other power converters, and other electronic circuits.

These and other embodiments of the invention are described in detail in the Detailed Description with reference to the Figures. In the Figures, like numerals may reference like elements and descriptions of some elements may not be repeated.

DETAILED DESCRIPTION OF THE INVENTION

Figure 1:
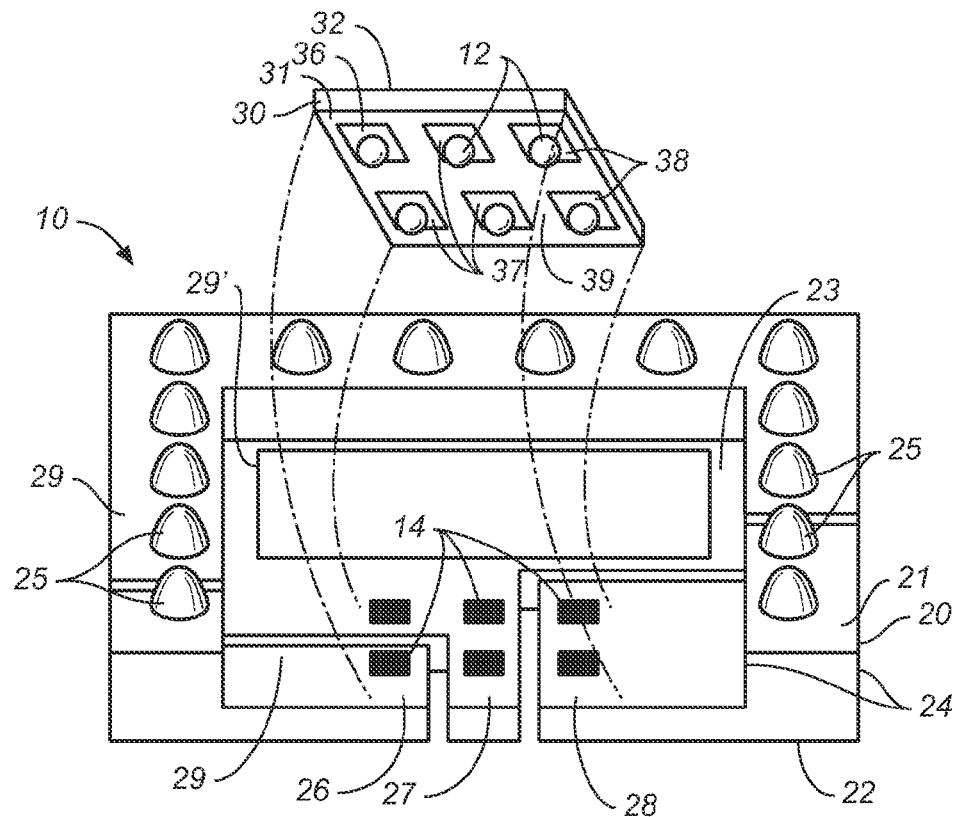
FIGS. 1 and 3 are expanded perspective views of portions of a first exemplary semiconductor die package according to the present invention.
Figure 3:
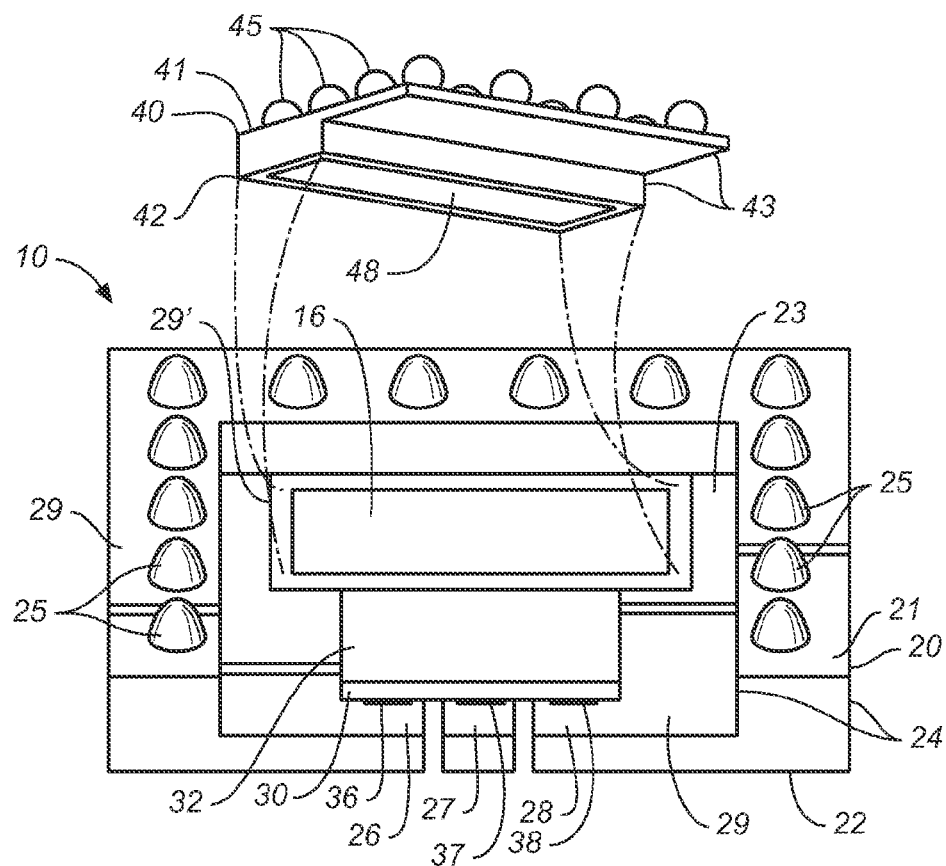

FIG. 1 shows a partial expanded perspective view of a first exemplary semiconductor die package 10 according to the present invention. Semiconductor die package 10 comprises a leadframe 20, a first semiconductor die 30, and a second semiconductor die 40 (shown in FIGS. 3 and 4). Leadframe 20 has a top surface 21, a bottom surface 22 opposite its top surface 21, a recess 23 disposed in top surface 21 to receive semiconductor dice, and a rim 24 disposed around at least a portion of recess 23. Leadframe 20 is partitioned into at least three conductive regions 26-28 (e.g., three leads). In an exemplary implementation, first semiconductor die 30 is electrically coupled to conductive regions 26-28, and second semiconductor die 40 is electrically coupled to second conductive region 27 (as illustrated in FIG. 3 and described below). A plurality of bumps 25 are disposed on rim 24 to facilitate electrical interconnections between leadframe 20 and an external substrate. There is at least one bump 25 for each of conductive regions 26-28. Bumps 25 may comprise the same material as leadframe 20, may comprise solder material alone, or may comprise solder material coated over smaller bumps of leadframe material. The leads, rim, recess, and bumps of leadframe 20 can be readily manufactured by conventional leadframe manufacturing steps, which include pattern stamping, pattern cutting, and pattern etching. Leadframe 20 may comprise a base layer of copper (Cu) that is coated or alloyed with the following order of metal sublayers: nickel (Ni), palladium (Pd), and gold (Au). Not shown is an outer ring that initially holds leadframe 20, which includes conductive regions 36-38, together; after the dice are assembled onto leadframe 20, the ring may be cut away.

Figure 2:
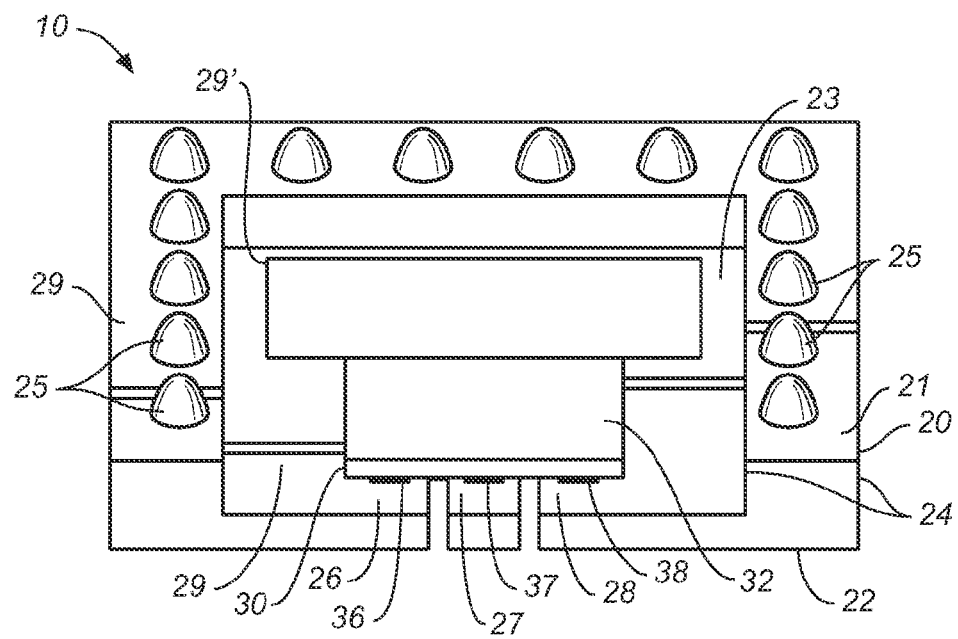
FIGS. 2 and 4 are the partially assembled perspective views thereof, respectively.

Referring to FIG. 1, first semiconductor die 30 comprises a first surface 31, a second surface 32 opposite to first surface 31, a first conductive region 36 disposed on first surface 31, a plurality of second conductive regions 37 disposed on first surface 31, and a plurality of third conductive regions 38 disposed on first surface 31. First semiconductor die 30 may comprise a solder mask 39 disposed over first surface 31 except in the locations of conductive regions 36-38. In an exemplary implementation, first semiconductor die 30 comprises a planar power device, preferably a power MOSFET device, having a modulation terminal (gate) at first conductive region 36, a first conduction terminal (source) at second conductive regions 37, and a second conduction terminal (drain) at third conductive regions 38. A plurality of solder-material bodies 12, such as in the form of reflowed solder bumps, may be disposed on conductive regions 36-38; and a plurality of solder-material bodies 14, such as in the form of solder paste, may be disposed on conductive regions 26-28. Leadframe 20 and first semiconductor die 30 are aligned together, with conductive regions 26-28 disposed opposite to conductive regions 36-38, respectively, and the solder is reflowed to electrically couple these regions together. The resulting assembly is shown in FIG. 2, with conductive regions 26-28 being electrically coupled to conductive regions 36-38, respectively. Leadframe 20 may comprise a solder mask 29 disposed over top surface 21 except in the locations of solder-material bodies 14, bumps 25, and a location 29' where second semiconductor die 40 will be attached. If bumps 25 do not comprise solder material, or if solder material will not disposed on the bumps in a later step, then solder mask 29 need slot be disposed over the top surface of rim 24. The other reference numbers shown in the figure were previously described with respect to FIG. 1.

Figure 4:
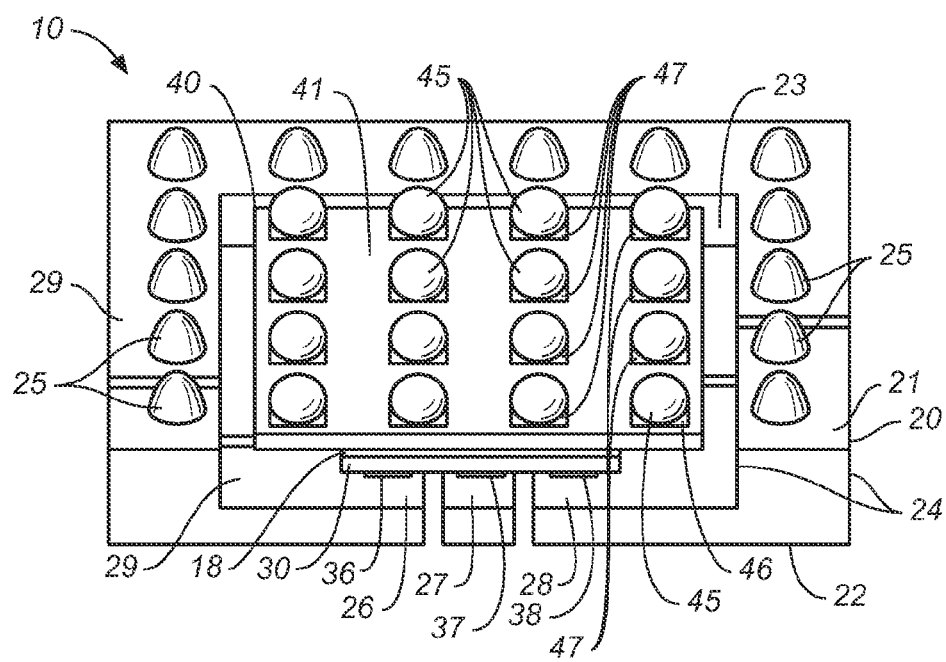

FIG. 3 shows a further partial expanded perspective view of semiconductor die package 10 as second semiconductor die 40 is being assembled onto leadframe 20. Second semiconductor die 40 has a first surface 41, second surface 42 opposite to first surface 41, a recessed portion 43 disposed at second surface 42, a first conductive region 46 disposed on first surface 41 (shown in FIG. 4), a plurality of second conductive regions 47 (shown in FIG. 4) disposed on first surface 41, and a third conductive region 48 disposed on second surface 42 in the area that is not recessed. Respective solder bumps 45 may be disposed on conductive regions 46 and 47. Recessed portion 43 may also be called a step portion, an indented portion, and the like. A body 16 of solder material, such as in the form of a layer of solder paste, is disposed on location 29' of leadframe 20. Second semiconductor die 40 is then disposed within recess 23 of leadframe 20 such that portions of its recessed portion 43 and the second surface 32 of die 30 face one another, and such that its third conductive region 48 contacts solder-material body 16. Next, solder-material body 16 is reflowed to provide an electrical coupling between third conductive region 48 and second conductive region 27 of leadframe 20 in the area of location 29'. The resulting structure is shown in FIG. 4, where it can be seen that the first surface 41 of second die 40 is substantially flush with the top of the leadframe's rim 24. While the above embodiment has been illustrated with solder-material bodies 12-16 being reflowed in separate steps, they can be reflowed simultaneously in a common reflow step. In an exemplary implementation, second semiconductor die 40 comprises a vertical power device, preferably a power MOSFET device, having a modulation terminal (gate) at first conductive region 46, a first conduction terminal (source) at second conductive regions 47, and a second conduction terminal (drain) at third conductive region 48.

Package 10 can thereby provide two semiconductor die in the space of one, and thus provide the same functionality in a more compact package. In addition, both die are coupled to leadframe 20, which in turn may be coupled to an electrically insulated heat-sink. In this regard, when die 40 is used as a synchronous rectifier of a buck converter, the die having the need for the greatest power dissipation (e.g., die 40) can have the greater amount of thermal conductivity to leadframe 20 since conductive region 48 can be made very large. In one exemplary implementation, first semiconductor die 30 has a thickness of about 100 microns, and second semiconductor die 40 has a thickness of about 300 microns, with its recessed portion 43 being about 200 microns deep. In typical implementations, the second surface 32 and 42 of the dice are not electrically coupled together, and a gap 18 is present between them. However, for other implementations, they may be attached and/or electrically coupled to one another. In these other implementations, an electrical coupling of surface 32 and 42 may provide a body potential for die 30 when die 30 comprises a planar power device, or may provide a coupling between conduction terminals of dice 30 and 40 when dice 30 comprises a vertical power device.

Figure 5:
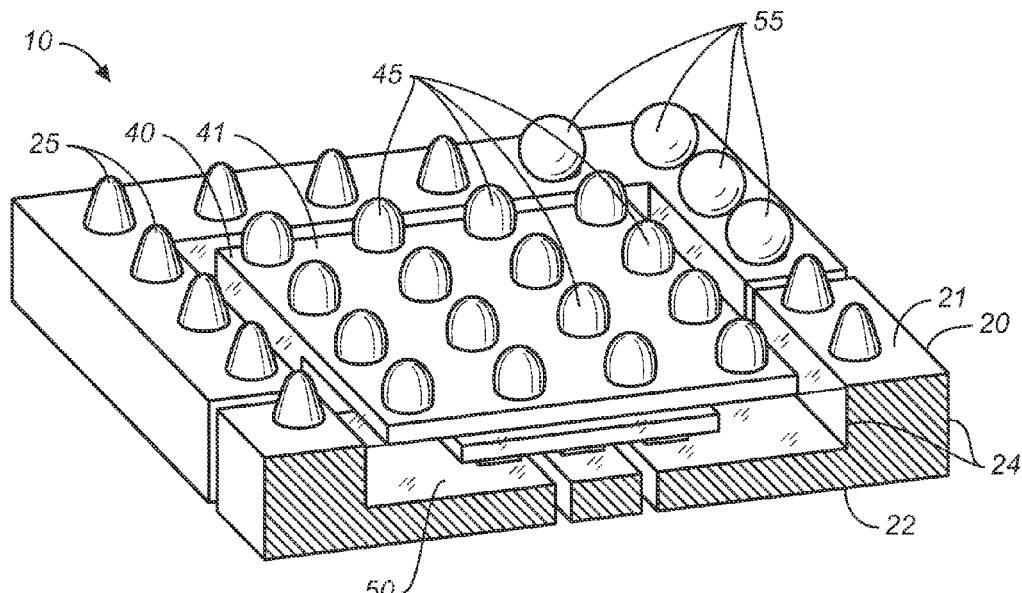
FIG. 5 is a perspective view of the first exemplary semiconductor die package according to the present invention as assembled in a core form, and to which an electrically insulated heat sink may be coupled.

Referring to FIG. 5, a body 50 of an electrically insulating material is disposed within the unfilled portions of recess 23, and optionally within gap 18, if present. The material of body 50 may comprise an underfill material or an injectable molding material. Body 50 provides mechanical support to dice 30 and 40 in addition to that provided by solder material bodies 12-16. Also, as an optional step, a plurality of solder bumps 55 may be formed on the leadframes bumps 25, as illustrated with a set of four bumps in the figure. Additional molding material (not shown in FIG. 5) may be disposed around the sides of package 10. Package 10 may be mounted to a system substrate at first surface 21 of leadframe 20, and an electrically insulated heat sink may be coupled to second surface 22 of leadframe 20. If a heat sink is not needed for a particular application, additional molding material (not shown in FIG. 5) may be disposed on second surface 22.

Figure 6:
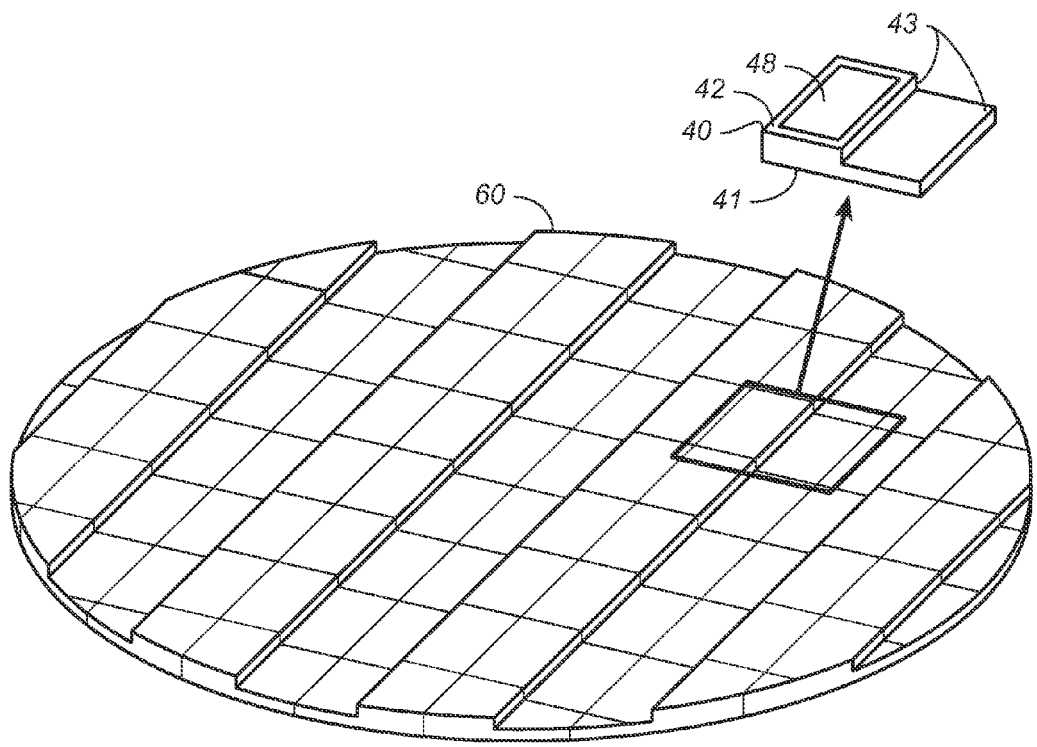
FIG. 6 shows a perspective view of an exemplary semiconductor wafer from which an exemplary die for the first exemplary semiconductor package may be taken.

Referring to FIG. 6, the recessed portion 43 of die 40 may be made using a backside etching process while the die is still part of a semiconductor wafer, which is shown at 60. Several instances of second semiconductor die 40 may be manufactured on wafer 60 in a plurality of rows, and before the instances are diced from the wafer, a patterned backside etch may be performed along edges of the rows to define the recessed portions 43 of all the instances. For silicon devices, a so-called "hot KOH" etch may be used, along with a suitable mask material.

Figure 7:
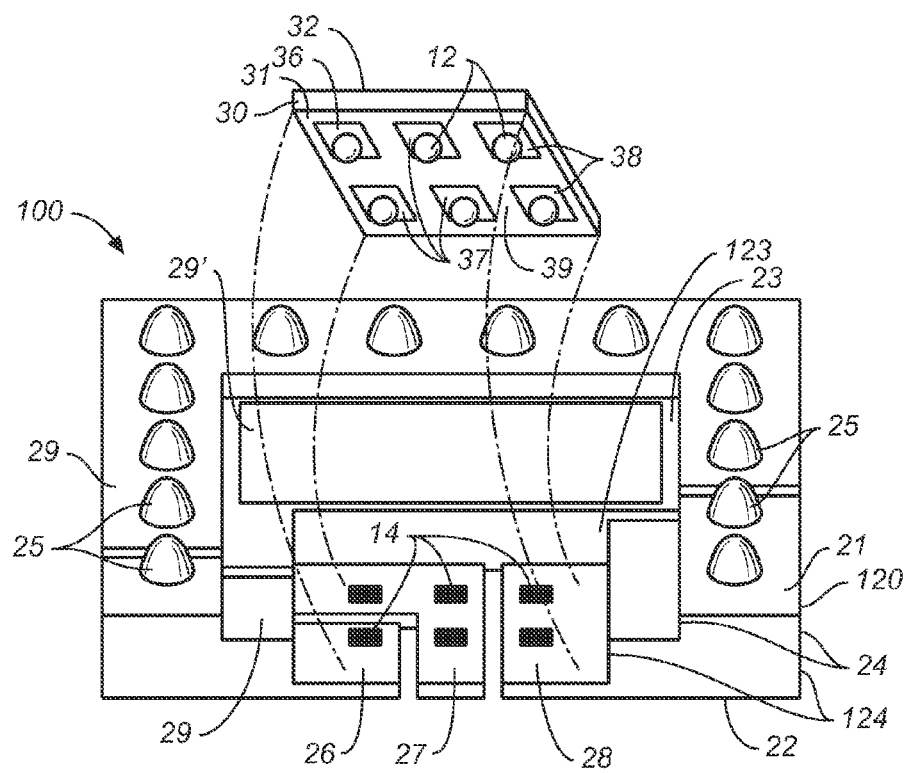
FIG. 7 is an expanded perspective view of a portion of a second exemplary semiconductor die package according to the present invention.
Figure 8:
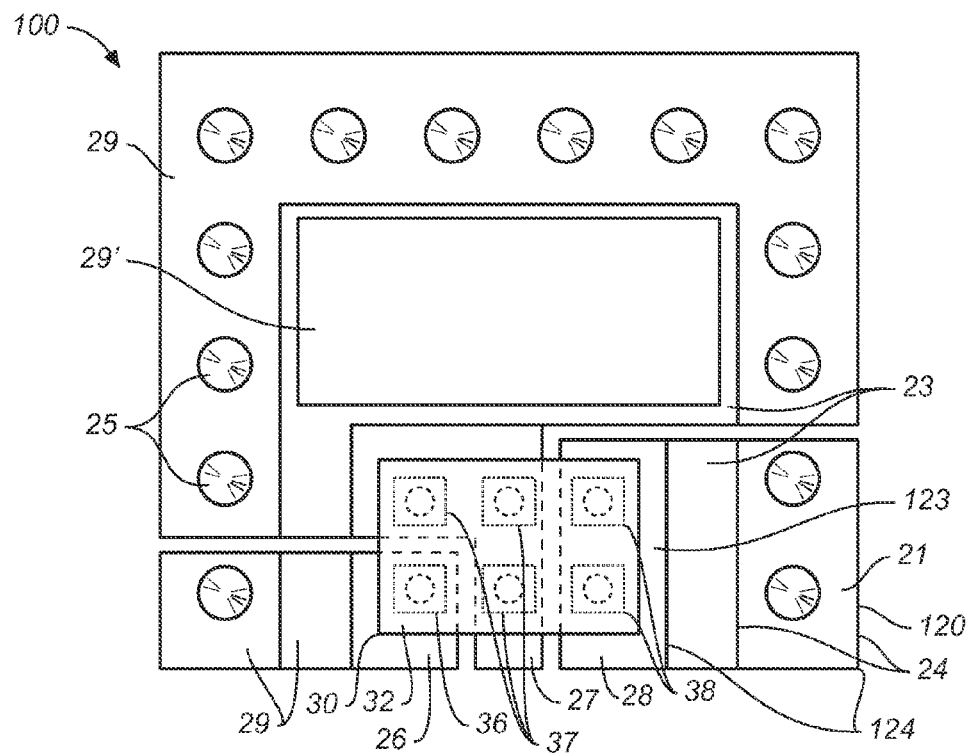
FIG. 8 is a top plan view.

FIG. 7 shows a partial expanded perspective view of a second exemplary semiconductor die package 100 according to the present invention. Semiconductor die package 100 comprises a leadframe 120, a first semiconductor die 30 as previously described, and a second semiconductor die 40' (shown in FIGS. 10 and 11). Like leadframe 20, leadframe 120 has a top surface 21, a bottom surface 22 opposite top surface 21, a recess 23 disposed in top surface 21 to receive semiconductor dice, and a rim 24 disposed around at least a portion of recess 23. Leadframe 120 is also partitioned into at least three conductive regions 26-28 (e.g., three leads), and has a plurality of bumps 25 disposed on rim 24 to facilitate electrical interconnections between leadframe 120 and an external substrate. There is at least one bump 25 for each of conductive regions 26-28. Unlike leadframe 20, leadframe 120 further comprises a second recess 123 disposed in top surface 21, and a rim 124 disposed around at least a portion of recess 123. A major portion of recess 123 lies within the extent of recess 23, and preferably all of recess 123 lies within the extent of recess 23. In an exemplary implementation, first semiconductor die 30 is disposed within second recess 123 with its conductive regions 36-38 electrically coupled to conductive regions 26-28 with solder-material bodies 12-14, as previously described above, and second semiconductor die 40' is disposed within recess 23 and electrically coupled to second conductive region 27 (as illustrated in FIG. 11 and described below). FIG. 8 shows a top plan view of package 100 after leadframe 120 and first die 30 have been assembled together. The leads, rims, recesses, and bumps of leadframe 120 can be readily manufactured by conventional leadframe manufacturing steps, which include pattern stamping, pattern cutting, and pattern etching. Leadframe 120 may comprise a base layer of copper (Cu) that is coated or alloyed with the following order of metal sub-layers: nickel (Ni), palladium (Pd), and gold (Au). Not shown is an outer ring that initially holds leadframe 120, which includes conductive regions 36-38, together; after the dice are assembled onto leadframe 120, the ring may be cut away. The other reference numbers shown in FIG. 8 have been previously described above.

Figure 9:
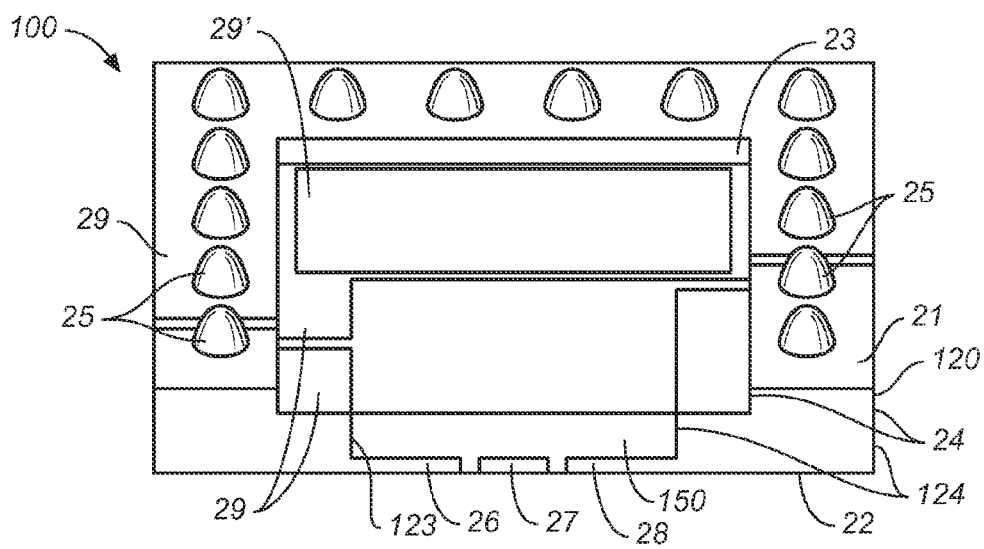
FIG. 9 is a perspective view, of a portion of the second exemplary semiconductor die package according to the present invention.

Referring to FIG. 9, after first semiconductor die 30 and leadframe 120 are assembled, a body 150 of an electrically insulating material may be disposed over die 30 and within the unfilled portions of recess 123. The material of body 150 may comprise an underfill material or an injectable molding material. Body 150 provides mechanical support to die 30 in addition to that provided by solder bodies 12-14, and can provide electrical insulation between dice 30 and 40', if needed. The other reference numbers shown in FIG. 9 have been previously described above.

Figure 10:
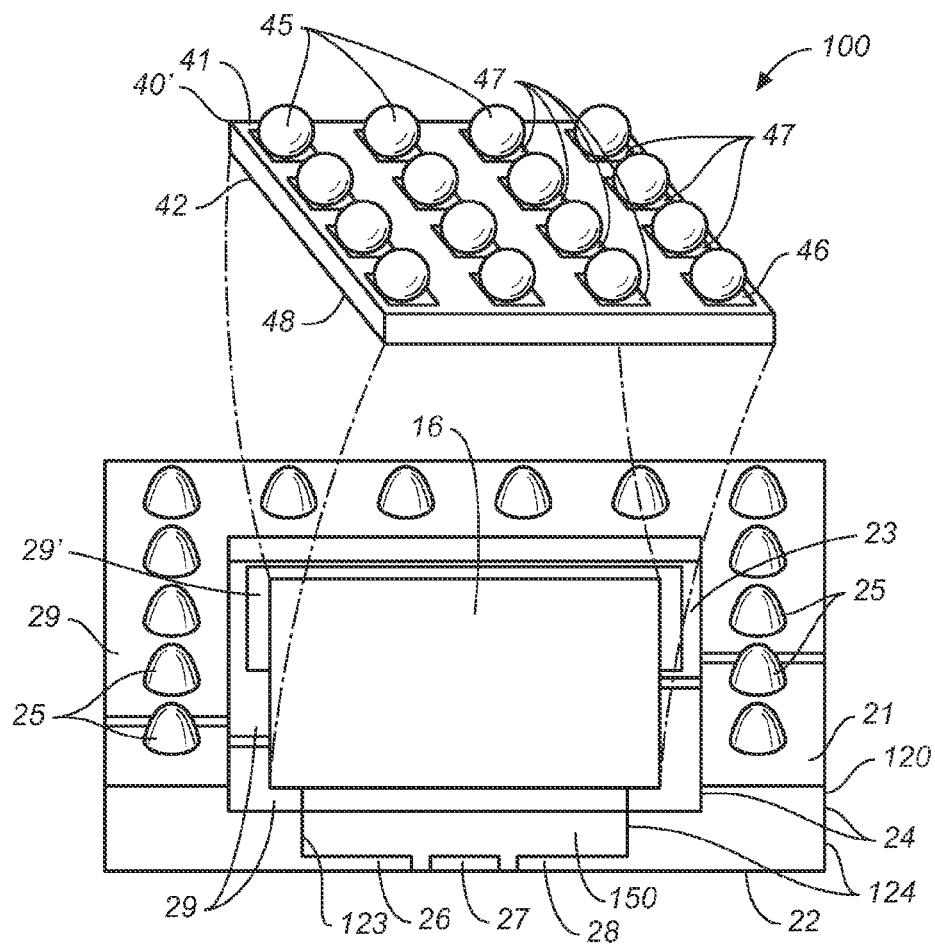
FIG. 10 is a further expanded perspective view of a portion of a second exemplary semiconductor die package according to the present invention.
Figure 11:
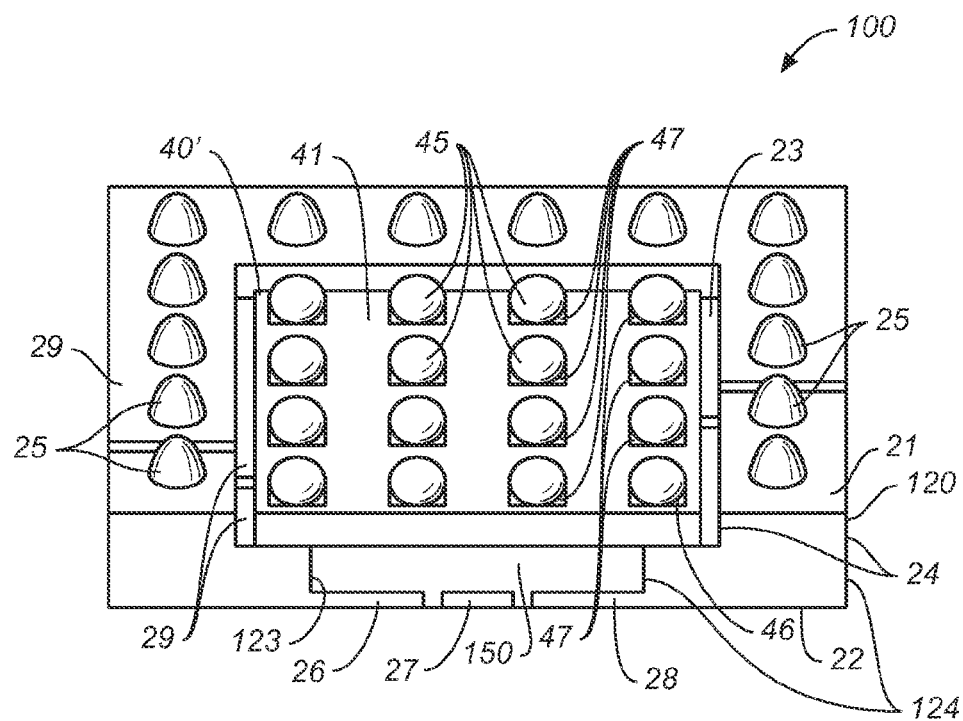
FIG. 11 is a perspective view of the second exemplary semiconductor die package according to the present invention as assembled in a core form, and to which an electrically insulated heat sink may be coupled.

FIG. 10 shows a further partial expanded perspective view of semiconductor die package 100 as second semiconductor die 40' is being assembled onto leadframe 120. Second semiconductor die 40' has a first surface 41, second surface 42 opposite to first surface 41, a first conductive region 46 disposed on first surface 41, a plurality of second conductive regions 47 disposed on first surface 41, and a third conductive region 48 (not shown) disposed on second surface 42 in at least the same way as for die 40 shown in FIG. 3 (and the reader may refer to FIG. 3 for an implementation of third conductive region 48). Second surface 42 may be planar, without a recess, and third conductive region 48 may be disposed over a major portion, or substantially all, of second surface 42. Respective solder bumps 45 may be disposed on conductive regions 46 and 47. A body 16 of solder material, such as in the form of a layer of solder paste, may be disposed on location 29' of leadframe 120, and optionally on adjacent portions electrically insulating body 150 and portions of solder mask 29 that cover conductive regions 26 and 28. Second semiconductor die 40' is then disposed within recess 23 of leadframe 120 such that its third conductive region 48 contacts solder-material body 16. Next, solder-material body 16 is reflowed to provide an electrical coupling between third conductive region 48 and second conductive region 27 of leadframe 120 in the area of location 29'. The portions of body 16 initially disposed on body 150 and solder mask 29 are typically drawn by capillary action toward area 29' during the reflow step, and small gaps may be formed between second surface 42 of die 40' and each of electrically insulating body 150 and conductive regions 26 and 28. The resulting structure is shown in FIG. 11, where it can be seen that the first surface 41 of second die 40' is substantially flush with the top of the leadframe's rim 24. While the above embodiment has been illustrated with solder-material bodies 12-16 being reflowed in separate steps, they can be reflowed simultaneously in a common reflow step. In an exemplary implementation, second semiconductor die 40' comprises a vertical power device, preferably a power MOSFET device, having a modulation terminal (gate) at first conductive region 46, a first conduction terminal (source) at second conductive regions 47, and a second conduction terminal (drain) at third conductive region 48. The other reference numbers shown in FIG. 11 have been previously described above.

Package 100 can thereby provide two semiconductor dice in the space of one, and thus provide the same functionality in a more compact package. In addition, both dice are coupled to leadframe 120, which in turn may be coupled to an electrically insulated heat-sink. In this regard, when die 40' is used as a synchronous rectifier of a buck converter, the die having the need for the greatest power dissipation (e.g., die 40') can have the greater amount of thermal conductivity to leadframe 120 since conductive region 48 can be made very large. In one exemplary implementation, first semiconductor die 30 has a thickness of about 100 microns, and second semiconductor die 40 has a thickness of about 200 microns, recess 23 has a depth of about 200 microns, and recess 123 has a depth of about 200 microns, as measured from the bottom of recess 23. In typical implementations, the second surface 32 and 42 of the dice are not electrically coupled together, and electrically insulating body 150 is disposed between them. However, for other implementations, they may be attached and/or electrically coupled to one another. In these other implementations, an electrical coupling of surface 32 and 42 may provide a body potential for die 30 when die 30 comprises a planar power device, or may provide a coupling between conduction terminals of dice 30 and 40' when dice 30 comprises a vertical power device.

Thus, it may be appreciated that the above description illustrates a method of assembling a semiconductor die package that comprises assembling the leadframe, the first semiconductor die, and the second semiconductor die together with the first semiconductor die disposed within the recessed area of the leadframe, with at least a portion of the second surface of the first semiconductor die and at least a portion of the second surface of the second semiconductor die facing one another, and with at least one electrically conductive region of one of the semiconductor dice electrically coupled to the at least one electrically conductive region of the leadframe.

Figure 12:
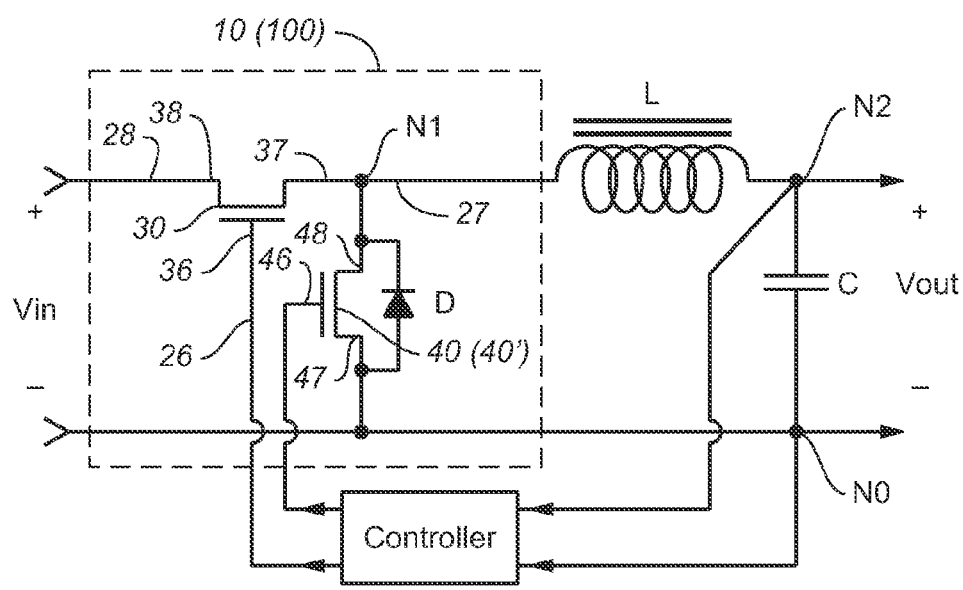
FIG. 12 is a schematic diagram of an exemplary buck-type power converter using an exemplary semiconductor die package according to the present invention.

FIG. 12 shows an exemplary buck converter using either of exemplary packages 10 and 100 according to the present invention. The exemplary buck converter comprises a power input port Vin, a power output port Vout, an instance of package 10 or 100, a buck inductor L, a storage capacitor C, a controller, a switch node N1, and output node N2, and a ground node N0 that is common to both input port Vin and output port Vout. Package 10 (or 100) is coupled to input port Vin such that the free conduction terminal 38 (e.g., drain) of first die 30 is coupled to the positive terminal of the input power port via conductive region (lead) 28, and such that the free conduction terminal 47 (e.g., source) of second die 40 (or 40') is coupled to the negative terminal of the input power port. The switching node N1 is provided by conductive region (lead) 27 of package 10 (or 100), which advantageously has very low parasitic capacitance and parasitic inductance, as previously described. The buck inductor L is coupled between nodes N1 and N2, and the storage capacitor C is coupled between nodes N2 and N0. The transistor of die 30 selectively couples buck inductor L to the input supply to increase the current flow and magnetic storage in the inductor, while the transistor of die 40 selectively couples the inductor to ground to provide a reset voltage and freewheeling path for the buck inductor (which prevents the inductor's magnetic core from saturating). For this application, die 40 (or 40') preferably has a freewheeling diode D integrated with the transistor. The controller measures the value of the output voltage at output port Vout, and adjusts the switching of the power transistors of dice 30 and 40 to regulate the output voltage to a desired level. The transistors of dice 30 and 40 are switched on and off in an alternating manner, with one transistor being off while the other is on. A cycle of fixed time duration is generally used, but the controller may vary the cycle time. In either event, the relative duty cycle of the transistor of die 30 is varied to regulate the output voltage.

Figure 13:
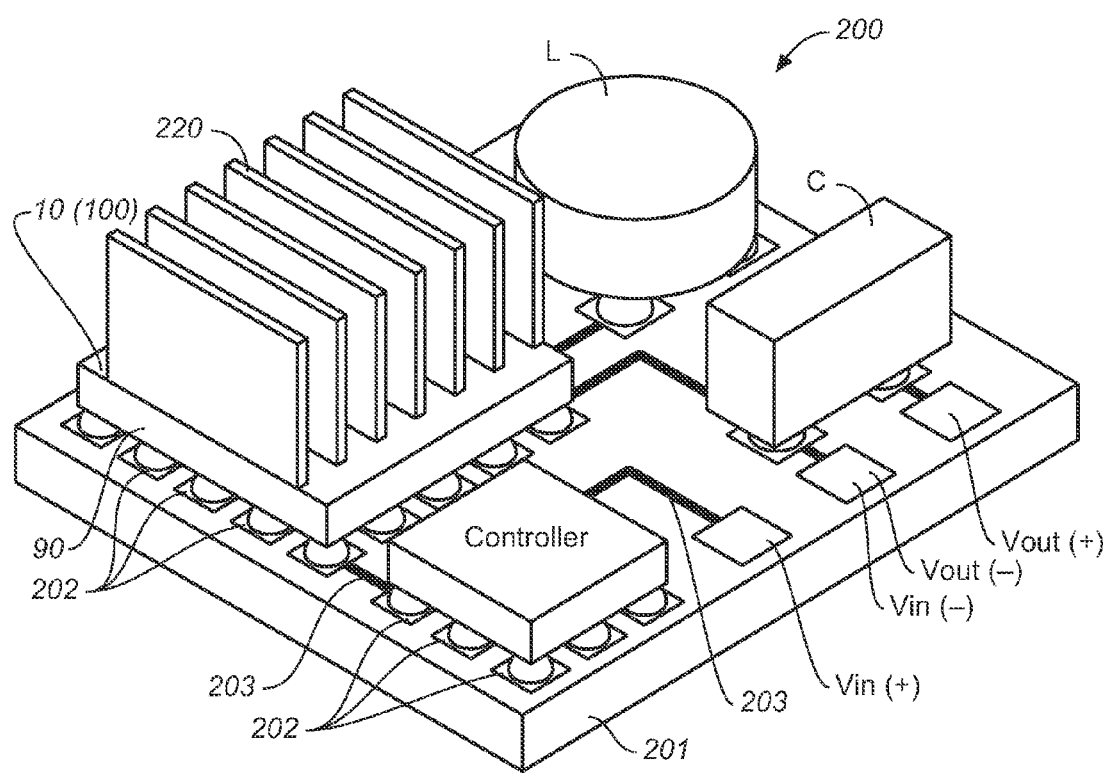
FIG. 13 is a perspective view of an exemplary system using an exemplary semiconductor die package according to the present invention.

FIG. 13 shows a perspective view of a system 200 that incorporates an exemplary package, either or both of packages 10 and 100, according to the present invention. System 200 comprises an interconnect substrate 201, a plurality of interconnect pads 202 to which components are attached, a plurality of interconnect traces 203 (only a few of which are shown for the sake of visual clarity), an instance of package 10 (or 100), a buck inductor L, a storage capacitor C, and a controller. The electrical components may be configured as described above with reference to FIG. 12, and a plurality of solder bumps may be used to electrically couple the electrical components to interconnect substrate 201. Pads for Vin(+), Vin(−), Vout(+), Vout(−) may be provided, or system 200 may have a larger interconnect substrate 201 where the input and output voltage are brought in by traces. An electrically insulating body 90 may be formed around package 10 (100), and a heat sink 220 may be thermally coupled to the exposed surface of the package.

The semiconductor die packages described above can be used in electrical assemblies including circuit boards with the packages mounted thereon. They may also be used in systems such as phones, computers, etc.

Some of the examples described above are directed to "leadless" type packages such as MLP-type packages (microleadframe packages) where the terminal ends of the leads do not extend past the lateral edges of the molding material. Embodiments of the invention may also include leaded packages where the leads extend past the lateral surfaces of the molding material.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A semiconductor die package comprising:
a leadframe having at least a first electrically conductive region and a second electrically conductive region;
a first semiconductor die having a first surface, a second surface, and at least one electrically conductive region disposed at its first surface, wherein the first semiconductor die is disposed such that its at least one electrically conductive region is disposed opposite to the first electrically conductive region of the leadframe and is electrically coupled thereto by a body of solder material;
a second semiconductor die having a first surface, a second surface, a recessed portion at its second surface, and at least one electrically conductive region disposed at its second surface, wherein the second semiconductor die is disposed such that its at least one electrically conductive region is disposed opposite to the second electrically conductive region of the leadframe and is electrically coupled thereto by a body of solder material; and
wherein at least a portion of the second surface of the first semiconductor die and at least a portion of the recessed portion of the second semiconductor die face each other.

2. The semiconductor die package of claim 1 wherein the leadframe further has a recessed area and a rim area disposed around at least a portion of the recessed area, wherein the first die is disposed within the recessed area, wherein the leadframe has a first thickness in the recessed area, wherein the leadframe has a second thickness in the rim area, and wherein first thickness is less than the second thickness.

3. The semiconductor die package of claim 2 wherein the leadframe further comprises a plurality of frame bumps disposed on at least a portion of the rim area, wherein the rim area and the frame bumps are comprised of the same material.

4. The semiconductor die package of claim 1 wherein a body of electrically insulating material is disposed between the second surface of the second semiconductor die and the second surface of the first semiconductor die.

5. The semiconductor die package of claim 1 wherein the leadframe has a recess, and wherein the first and second dice are disposed within the recess.

6. The semiconductor die package of claim 1 wherein the first semiconductor die has a power dissipation that is lower than that of the second semiconductor die.

7. The semiconductor die package of claim 1 wherein the lead frame further comprises frame bumps disposed on at least a portion that is adjacent to the second semiconductor die.

8. A system comprising the semiconductor die package of claim 1, wherein the semiconductor die package is attached to a substrate.

9. The system of claim 8 further comprising a buck power converter having at least one switching transistor, wherein the at least one switching transistor is disposed on one of the first and semiconductor dice.

10. A semiconductor die package comprising:
a leadframe having a first surface, a second surface, a recessed area disposed at the first surface, and at least a first electrically conductive region disposed at the first surface and a second electrically conductive region disposed at the first surface;
a first semiconductor die having a first surface, a second surface, and at least one electrically conductive region disposed at its first surface, the first semiconductor die being disposed in the recessed area of the leadframe such that its at least one electrically conductive region is disposed opposite to the first electrically conductive region of the leadframe and is electrically coupled thereto by a body of solder material;
a second semiconductor die having a first surface, a second surface, and at least one electrically conductive region disposed at its second surface, the second semiconductor die being disposed over at least a portion of the recessed area of the leadframe, and over at least a portion of the first semiconductor die, wherein the second semiconductor die is further disposed such that its at least one electrically conductive region is disposed opposite to the second electrically conductive region of the leadframe and is electrically coupled thereto by a body of solder material.

11. The semiconductor die package of claim 10 wherein the leadframe further has a rim area disposed around at least a portion of the recessed area wherein the leadframe has a first thickness in the recessed area, wherein the leadframe has a second thickness in the rim area, and wherein first thickness is less than the second thickness.

12. The semiconductor die package of claim 11 wherein the leadframe further comprises a plurality of frame bumps disposed on at least a portion of the rim area, wherein the rim area and the frame bumps are comprised of the same material.

13. The semiconductor die package of claim 10 wherein a body of electrically insulating material is disposed over at least a portion of the second surface of the first semiconductor die and at least a portion of the leadframe's recessed area.

14. The semiconductor die package of claim 10 wherein the recessed area is a first recessed area, wherein the leadframe further comprises a second recessed area, wherein the first recessed area is disposed within second recessed area, and wherein the second semiconductor die is disposed within the second recessed area.

15. The semiconductor die package of claim 10 wherein the first semiconductor die has a power dissipation that is lower than that of the second semiconductor die.

16. The semiconductor die package of claim 10 wherein the lead frame further comprises frame bumps disposed on at least a portion that is adjacent to the second semiconductor die.

17. A system comprising the semiconductor die package of claim 10, wherein the semiconductor die package is attached to a substrate.

18. The system of claim 17 further comprising a buck power converter having at least one switching transistor, wherein the at least one switching transistor is disposed on one of the first and semiconductor dice.

19. A method of assembling a semiconductor die package, the semiconductor die package having a leadframe, a first semiconductor die, and a second semiconductor die, the leadframe having at least a first electrically conductive region and a second electrically conductive region, the first semiconductor die having a first surface, a second surface, and at least one electrically conductive region disposed at its first surface, the second semiconductor die having a first surface, a second surface, a recessed portion at its second surface, and at least one electrically conductive region disposed at its second surface, the method comprising:

assembling the leadframe, the first semiconductor die, and the second semiconductor die together with at least a portion of the second surface of the first semiconductor die and at least a portion of the recessed portion of the second semiconductor die facing one another, with the at least one electrically conductive region of the first semiconductor die disposed opposite to the first electrically conductive region of the leadframe and electrically coupled thereto by a body of solder material, and with the at least one electrically conductive region of the second semiconductor die disposed opposite to the second electrically conductive region of the leadframe and electrically coupled thereto by a body of solder material.

20. The method of claim 19 wherein assembling the leadframe, first semiconductor die, and the second semiconductor die together comprises:

disposing the first semiconductor die over a first portion of the leadframe;

disposing the second semiconductor die over a second portion of the leadframe with at least a portion of the second semiconductor die's recessed portion overlying at least a portion of the first semiconductor die.

21. The method of claim 20 wherein the first portion of the leadframe is located over the leadframe's first electrically conductive region, and wherein disposing the first semiconductor die comprises disposing a first body of solder material on one or both of the first portion of the leadframe and the at least one electrically conductive region of the first semiconductor die, placing the at least one electrically conductive region of the first semiconductor die over the first portion of the leadframe, and reflowing the first body solder material.

22. The method of claim 21 wherein the second portion of the leadframe is located over the leadframe's second electrically conductive region, and wherein disposing the second semiconductor die comprises disposing a second body solder material on one or both of the second portion of the leadframe and the at least one electrically conductive region of the second semiconductor die, placing the at least one electrically conductive region of the second semiconductor die over the second portion of the leadframe, and reflowing the second body of solder material.

23. The method of claim 22 wherein the first and second bodies of solder material are simultaneously reflowed.

24. The method of claim 20 wherein the second portion of the leadframe is located over the leadframe's second electrically conductive region, wherein disposing the second semiconductor die comprises disposing a body solder material on one or both of the second portion of the leadframe and the at least one electrically conductive region of the second semiconductor die, placing the at least one electrically conductive region of the second semiconductor die over the second portion of the leadframe, and reflowing the body of solder material.

25. A method of assembling a semiconductor die package, the semiconductor die package having a leadframe, a first semiconductor die, and a second semiconductor die, the leadframe having a first surface, a second surface, a recessed area disposed at the first surface, and at least a first electrically conductive region disposed at the first surface and a second electrically conductive region disposed at the first surface, the first semiconductor die having a first surface, a second surface, and at least one electrically conductive region disposed at its first surface, the second semiconductor die having a first surface, a second surface, and at least one electrically conductive region disposed at its second surface, the method comprising:

assembling the leadframe, the first semiconductor die, and the second semiconductor die together with the first semiconductor die disposed within the recessed area of the leadframe, with at least a portion of the second surface of the first semiconductor die and at least a portion of the second surface of the second semiconductor die facing one another, with the at least one electrically conductive region of the first semiconductor die disposed opposite to the first electrically conductive region of the leadframe and electrically coupled thereto by a body of solder material, and with the at least one electrically conductive region of the second semiconductor die disposed opposite to the second electrically conductive region of the leadframe and electrically coupled thereto by a body of solder material.

26. The method of claim 25 wherein assembling the leadframe, first semiconductor die, and the second semiconductor die together comprises:

disposing the first semiconductor die into the recessed area of the leadframe;

disposing the second semiconductor die onto the first surface of the leadframe with at least a portion of its second surface overlying at least a portion of the first semiconductor die.

27. The method of claim 26 wherein the leadframe's first electrically conductive region has a first portion located within the leadframe's recessed area, and wherein disposing the first semiconductor die comprises disposing a first body of solder material on one or both of the first portion and the at least one electrically conductive region of the first semiconductor die, placing the at least one electrically conductive region of the first semiconductor die over the first portion, and reflowing the first body solder material.

28. The method of claim 27 wherein the leadframe's second electrically conductive region has a second portion located outside of the leadframe's recessed area, and wherein disposing the second semiconductor die comprises disposing a second body of solder material on one or both of the second portion and the at least one electrically conductive region of the second semiconductor die, placing the at least one electrically conductive region of the second semiconductor die over the second portion, and reflowing the second body of solder material.

29. The method of claim 28 wherein the first and second bodies of solder material are simultaneously reflowed.

30. The method of claim 26 wherein the leadframe's second electrically conductive region has a first portion located outside of the leadframe's recessed area, and wherein disposing the second semiconductor die comprises disposing a body of solder material on one or both of the first portion of the leadframe's a second electrically conductive region and the at least one electrically conductive region of the second semiconductor die, placing the at least one electrically conductive region of the second semiconductor die over the first portion of the leadframe's second electrically conductive region, and reflowing the body of solder material.

* * * * *